Nov. 28, 1967 J. C. MALLIA 3,354,542

ENCLOSING A METAL SUPPORT WITH A PRINTED CIRCUIT CONTAINING ENVELOPE

Filed May 10, 1965 2 Sheets-Sheet 1

INVENTOR
J. C. MALLIA
By [signature]
ATTORNEY 3,354,542

ENCLOSING A METAL SUPPORT WITH A PRINTED CIRCUIT CONTAINING ENVELOPE

Joseph C. Mallia, Colonia, N.J., assignor to Western Electric Company, Incorporated, New York, N.Y., a corporation of New York Filed May 10, 1965, Ser. No. 454,574
2 Claims. (Cl. 29—625)

ABSTRACT OF THE DISCLOSURE

A method for making a printed circuit board wherein a metal substrate having holes located at predetermined regions is inserted into an envelope of dielectric material which envelope has a printed electrical circuit. A mold-die operation seals the envelope, fuses the dielectric to the substrate and forms the hole interiors with the dielectric materials and conductor material from the electrical circuit.

This invention relates to printed circuit boards and particularly to a new and improved method of making a printed circuit board.

Printed circuit boards of the type disclosed in the pending application of D. Dinella, Ser. No. 220,383 filed Aug. 30, 1962, now abandoned, and which include a metal substrate have found wide-spread acceptance and use in the communications field. The manufacture of circuit boards having a metal substrate, however, involves a plurality of operations, several of which are time-consuming and critical in nature. In commercial practice, the metal substrates are insulated by a coating of resin applied by the fluidized bed process while the circuit paths are applied by an electroless process. Both processes require a number of independent operations which must be performed under controlled conditions to assure a satisfactory product.

Accordingly, an object of this invention is to provide a new and improved method for making a printed circuit board having a metal substrate.

Another object of this invention is to provide a method of producing an improved printed circuit board in an economic and expeditious manner.

A further object of this invention is to provide a method for making a printed circuit board including a metal substrate covered with a flexible dielectric which is of heat sensitive curable material having a circuit applied thereon.

A more specific object of this invention is to provide a method for making a new and improved printed circuit board by inserting a perforated metal substrate into an envelope formed by a flexible dielectric material having a printed circuit located thereon and causing the dielectric to adhere to the substrate to produce a unitary printed circuit board assembly.

In its broader aspects, the invention comprises inserting a metal substrate within an envelope of dielectric material supporting an electrical circuit and on at least one side thereof, and bonding the envelope of dielectric material to the metal substrate. The dielectric material conforms generally to the outline of the metal substrate with the positions of the land areas, in the case of a perforated substrate, corresponding to the positions of the perforations in the substrate. After the metal blank or substrate is inserted into the flexible circuit envelope, the assembly is fed to a heated forming die for final forming and adhesion of the dielectric material to the substrate. Piloted mandrels mounted in the die pierce the center portion of the lands and form them within the perforations. The mandrels also pierce the dielectric material on one side of the envelope to form and join same with the mating dielectric material on the other side of the board at the land areas, the dielectric material entering opposite sides of a hole and fusing together to insulate the walls of each hole.

Other objects and advantages of the present invention will become more apparent when considered in conjunction with the following drawings wherein.

Figure 1:
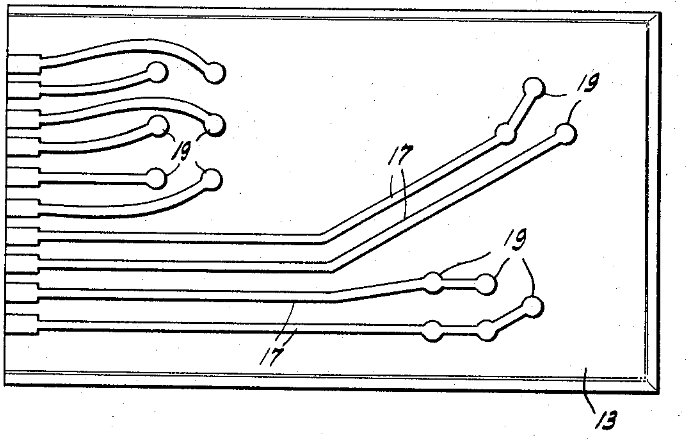
FIG. 1 illustrates a plan view of a typical printed circuit which is applied to a flexible dielectric material.
Figure 2:
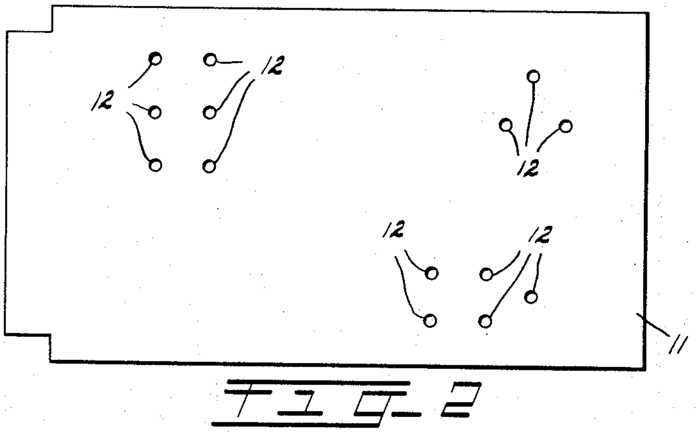
FIG. 2 illustrates a plan view of a metal substrate.
Figure 3:
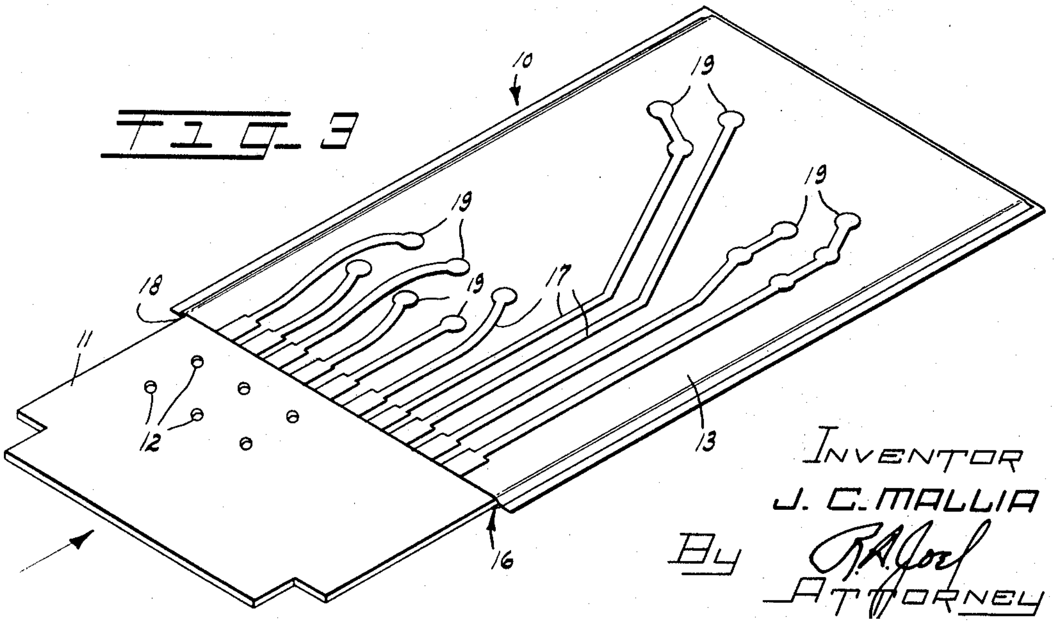
FIG. 3 is an isometric view showing the assembly of the metal substrate of FIG. 2 to a flexible circuit of FIG. 1 having the configuration of an open-ended envelope.

Referring now to the drawings, the invention involves a printed circuit board 10 comprising a metal substrate 11 having a plurality of perforations or holes 12 extending therethrough and a dielectric material 13 formed in the configuration of an open-ended envelope 16 and having a printed circuit 17 located thereon. The substrate blanks, preferably of steel or aluminum, are perforated in a separate operation to obtain the desired hole pattern while the circuit arrangement is applied to the flexible dielectric material 13 in a conventional manner. The dielectric material 13 is then formed into an envelope configuration 16 having an end opening 18 to receive a metal substrate 11. The substrate 11 and the circuit envelope 16 are assembled in the manner shown in FIG. 3 by inserting the substrate 11 into the envelope 16 so that the positions of the land areas 19 of the circuit correspond with the positions of the holes 12 in the board 10.

Figure 4:
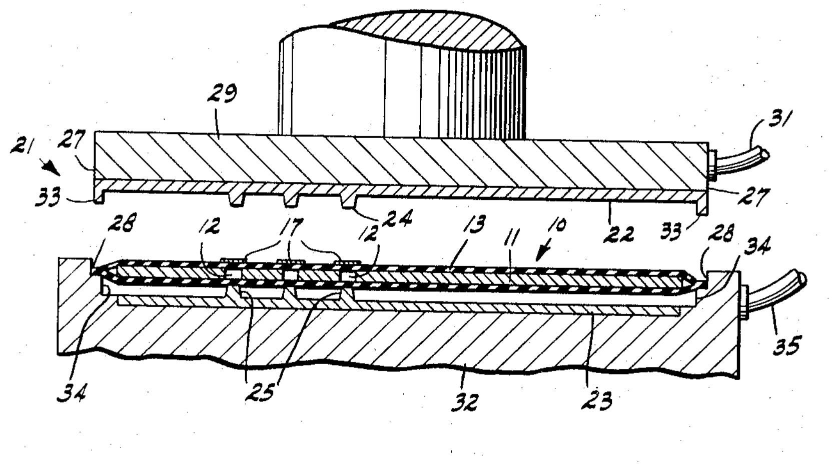
FIG. 4 illustrates a die arrangement for forming flexible circuitry having an envelope configuration to a metal substrate and connecting the circuit portions on opposite sides of the board.

The dielectric material 13 has adhesive properties and is preferably heat sensitive and curable by the application of pressure and heat. Typical dielectric materials are "Mylar" and a phenolic-impregnated polyester. These materials may be in an uncured condition for later bonding to the substrate. The board assembly is, then, fed to a heated forming die 21, see FIG. 4, for final forming and adhesion to the substrate 11. The above-disclosed method eliminates a plurality of chemicals and mechanical operations required in the manufacture of conventional printed circuit boards having a metal substrate 11. Furthermore, the present printed wiring boards may be positioned one on top of the other on at least one side of a substrate and bonded together to form an integral multiple layer circuit unit. The circuits in the various layers may be connected to one another to form a predetermined circuit pattern.

The forming die 21 includes upper and lower portions 22 and 23, respectively, having a plurality of piloted mandrels 24 and 25, respectively, mounted thereon. The upper portion 22 is mounted to the ram 29 of a conventional press while the lower portion 23 is mounted within a stationary bed 32. Lead wires 31 and 35 are connected to electrodes within the ram 29 and bed 32 to heat the upper and lower portions 22 and 23 of the forming die 21. The frustroconically shaped mandrels 24 pierce the lands 19 in the circuit, or penetrate existing pilot holes in the lands 19, and form them within the holes 12.

During the piercing operation, the dielectric material on one side of the substrate 11 is formed to join with the mating dielectric material on the other side of the board and fused together into an insulating coating covering the walls 26 of each hole 12. The center portion of the conductive land areas 19 are forced into corresponding apertures 12 to provide a contact surface for the terminals of electrical components (not shown) and possibly with a circuit path 17 on the opposite side of the board. In order to avoid the need to pierce the conductive land areas 19, the center portion thereof may be etched away during the application of the circuit 17 to the dielectric 13.

Figure 5:
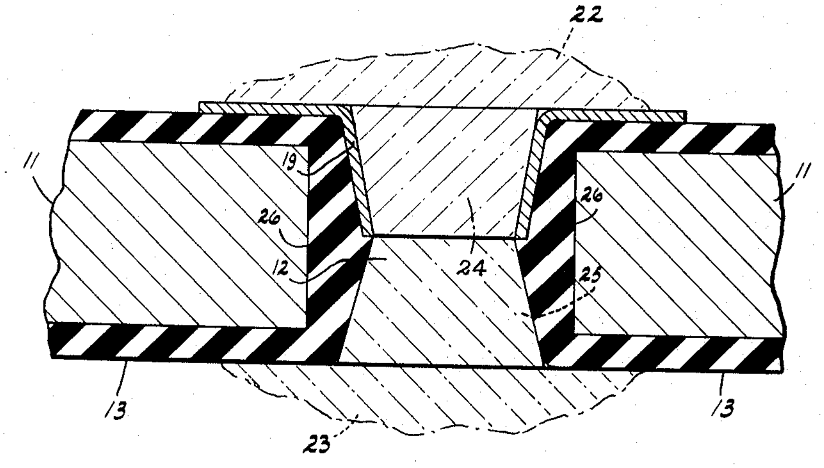
FIG. 5, which is a greatly enlarged view, illustrates in detail the interconnecting of flexible circuit portions on opposite sides of a circuit board through apertures in a metal substrate.

In some instances, it may be desirable to apply a heat curing adhesive to either the metal substrate 11 of the dielectric 13 to facilitate the formation of a permanent bond. Since the die 21 is normally maintained in the range of 200° F. to 300° F. by a suitable heating means (not shown), the dielectric material 13 becomes permanently affixed to the metal substrate 11 upon contact with the die 21. The above forming operation is shown in detail in FIG. 5. The upper portion 22 of the forming die 21 is equipped with a trimming surface 27 to cooperate with a lower portion 28 of the forming die 21 to trim any excess insulation. The protruding portions 33 on the upper portion 22 of the die 21 are designed to cooperate with the shelf-like extensions 34 in the lower portion 23 of the die 21 to seal the end opening or openings 18 in the dielectric envelope 16 about the substrate 11.

While the invention is illustrated with the circuitry positioned about the external surface of an envelope-shaped dielectric 16, it is, of course, possible that individual dielectric sheets may be applied to the opposite sides of the substrate and the circuit paths 17 located thereon subsequently interconnected. It is also possible to apply the flexibly mounted circuitry to a base 11 which has previously been insulated with a coating of epoxy. The method of applying the copper circuitry to the flexible dielectric provides a reliable means of circuit application at a low cost. Combining a performed circuit with a metal substrate, the method of the present invention eliminates numerous chemical steps and provides a fast dependable method of circuit board manufacture.

It is to be understood that the above-described arrangements are simple illustrative examples of the application of the principles of the invention. Numerous other arrangements may be readily devised by those skilled in the art, which will embody the principles of the invention and fall within the spirit and scope thereof.

What is claimed is:

1. The method of making a printed circuit board comprising:

providing a metal substrate having a plurality of holes extending therethrough, inserting the metal substrate into a dielectric envelope supporting an electrical circuit on at least one side thereof so that the positions of the land areas of the electrical circuit correspond with the positions of the holes in the substrate, bonding the dielectric material to the metal substrate, forming the dielectric material about the walls of the holes, and permanently deforming and forcing portions of the land areas to extend into the holes, sealing the open end of the envelope to completely enclose the substrate within the envelope, and trimming the ends of the envelope to eliminate excess dielectric material.

2. The method of making a printed circuit board comprising:

providing a metal substrate having a plurality of holes extending therethrough, providing a sheet of dielectric material having the configuration of an enevelope open on at least one end, said sheet including an electrical circuit on at least one side thereof, inserting the metal substrate into the dielectric envelope so that the positions of the holes in the substrate correspond with the predetermined portions of the electrical circuit on the dielectric envelope, heating the dielectric material to bond the dielectric to the metal substrate, simultaneously piercing the portions of the dielectric envelope opposite each hole to form the dielectric material about, and bond the dielectric material to, the walls of the hole, and permanently deforming and forcing portions of the electrical circuit to extend into the holes, and sealing the open end of the dielectric envelope to completely enclose the substrate within the envelope.

References Cited

UNITED STATES PATENTS

| | | | |
|---|---|---|---|
| 2,781,820 | 2/1957 | Rogers | 156—252 X |
| 2,829,081 | 4/1958 | Sween | 156—300 |
| 3,052,019 | 9/1962 | Strasser | 29—424 |
| 3,165,672 | 1/1965 | Gellert | 317—100 |
| 3,259,805 | 7/1966 | Osipchak et al. | 29—155.5 X |
| 3,263,023 | 7/1966 | Staley | 29—155.5 X |
| 3,296,099 | 1/1967 | Dinella | 204—15 |

JOHN F. CAMPBELL, *Primary Examiner.*

R. W. CHURCH, *Assistant Examiner.*